(12) United States Patent
Das et al.

(10) Patent No.: US 9,142,663 B2
(45) Date of Patent: Sep. 22, 2015

(54) SILICON CARBIDE DEVICES HAVING SMOOTH CHANNELS

(71) Applicant: Cree, Inc., Durham, NC (US)

(72) Inventors: Mrinal K. Das, Durham, NC (US); Michael Laughner, Clayton, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 14/482,137

(22) Filed: Sep. 10, 2014

(65) Prior Publication Data

US 2015/0028354 A1    Jan. 29, 2015

Related U.S. Application Data

(60) Division of application No. 13/470,600, filed on May 14, 2012, now Pat. No. 8,859,366, which is a continuation of application No. 12/424,960, filed on Apr. 16, 2009, now Pat. No. 8,188,483, which is a continuation of application No. 11/136,057, filed on May 24, 2005, now Pat. No. 7,528,040.

(51) Int. Cl.
*H01L 29/78*    (2006.01)
*H01L 29/08*    (2006.01)
(Continued)

(52) U.S. Cl.
CPC ........ *H01L 29/7802* (2013.01); *H01L 29/0873* (2013.01); *H01L 29/0886* (2013.01); *H01L 29/1608* (2013.01); *H01L 29/66068* (2013.01); *Y10S 438/931* (2013.01)

(58) Field of Classification Search
CPC ............ H01L 29/7802; H01L 29/0873; H01L 29/0886; H01L 29/1608; H01L 29/66068; Y10S 438/931
See application file for complete search history.

(56) References Cited

U.S. PATENT DOCUMENTS 3,629,011 A    12/1971    Tohi et al.
4,466,172 A    8/1984    Batra
(Continued)

FOREIGN PATENT DOCUMENTS

DE    19809554    9/1998
DE    19832329 A1    2/1999
(Continued)

OTHER PUBLICATIONS

International Search Report and Written Opinion for PCT/US2006/009493; date of mailing Mar. 16, 2007.
(Continued)

*Primary Examiner* — Long Pham
(74) *Attorney, Agent, or Firm* — Myers Bigel Sibley & Sajovec

(57) ABSTRACT

Methods of forming silicon carbide power devices are provided. An $n^-$ silicon carbide layer is provided on a silicon carbide substrate. A p-type silicon carbide well region is provided on the $n^-$ silicon carbide layer. A buried region of $p^+$ silicon carbide is provided on the p-type silicon carbide well region. An $n^+$ region of silicon carbide is provided on the buried region of $p^+$ silicon carbide. A channel region of the power device is adjacent the buried region of $p^+$ silicon carbide and the $n^+$ region of silicon carbide. An $n^-$ region is provided on the channel region and a portion of the $n^-$ region is removed from the channel region so that a portion of the $n^-$ region remains on the channel region to provide a reduction in a surface roughness of the channel region.

8 Claims, 9 Drawing Sheets

(51) Int. Cl.
  *H01L 29/16* (2006.01)
  *H01L 29/66* (2006.01)

(56) References Cited

U.S. PATENT DOCUMENTS

| | | | |
|---|---|---|---|
| 4,779,126 A | 10/1988 | Herman | |
| 4,811,065 A | 3/1989 | Cogan | |
| 5,111,253 A | 5/1992 | Korman et al. | |
| 5,170,231 A | 12/1992 | Fujii et al. | |
| 5,184,199 A | 2/1993 | Fujii et al. | |
| 5,270,554 A | 12/1993 | Palmour | |
| 5,348,895 A | 9/1994 | Smayling et al. | |
| 5,384,270 A | 1/1995 | Ueno | |
| 5,385,855 A | 1/1995 | Brown et al. | |
| 5,393,999 A | 2/1995 | Malhi | |
| 5,396,085 A | 3/1995 | Baliga | |
| 5,506,421 A | 4/1996 | Palmour | |
| 5,510,281 A | 4/1996 | Ghezzo et al. | |
| 5,510,630 A | 4/1996 | Agarwal | |
| 5,539,217 A | 7/1996 | Edmond et al. | |
| 5,629,531 A | 5/1997 | Palmour | |
| 5,663,580 A | 9/1997 | Harris et al. | |
| 5,710,059 A | 1/1998 | Rottner | |
| 5,726,463 A | 3/1998 | Brown et al. | |
| 5,734,180 A | 3/1998 | Malhi | |
| 5,763,905 A | 6/1998 | Harris | |
| 5,804,483 A | 9/1998 | Harris | |
| 5,814,859 A | 9/1998 | Ghezzo et al. | |
| 5,837,572 A | 11/1998 | Gardner et al. | |
| 5,851,908 A | 12/1998 | Harris et al. | |
| 5,877,041 A | 3/1999 | Fuller | |
| 5,917,203 A | 6/1999 | Bhatnagar et al. | |
| 5,972,801 A | 10/1999 | Lipkin et al. | |
| 5,976,936 A | 11/1999 | Miyajima et al. | |
| 6,020,600 A | 2/2000 | Miyajima et al. | |
| 6,025,233 A | 2/2000 | Teresawa | |
| 6,025,608 A | 2/2000 | Harris et al. | |
| 6,054,352 A | 4/2000 | Ueno | |
| 6,096,607 A | 8/2000 | Ueno | |
| 6,100,169 A | 8/2000 | Suvorov et al. | |
| 6,107,142 A | 8/2000 | Suvorov et al. | |
| 6,117,735 A | 9/2000 | Ueno | |
| 6,133,587 A | 10/2000 | Takeuchi et al. | |
| 6,162,665 A | 12/2000 | Zommer | |
| 6,165,822 A | 12/2000 | Okuno et al. | |
| 6,180,958 B1 | 1/2001 | Cooper, Jr. | |
| 6,204,135 B1 | 3/2001 | Peters et al. | |
| 6,221,700 B1 | 4/2001 | Okuno et al. | |
| 6,228,720 B1 | 5/2001 | Kitabatake et al. | |
| 6,238,967 B1 | 5/2001 | Shiho et al. | |
| 6,239,463 B1 | 5/2001 | Williams et al. | |
| 6,246,076 B1 | 6/2001 | Lipkin et al. | |
| 6,297,100 B1 | 10/2001 | Kumar et al. | |
| 6,303,508 B1 | 10/2001 | Alok | |
| 6,316,791 B1 | 11/2001 | Schorner et al. | |
| 6,344,663 B1 | 2/2002 | Slater, Jr. et al. | |
| 6,399,996 B1 | 6/2002 | Chang et al. | |
| 6,420,225 B1 | 7/2002 | Chang et al. | |
| 6,429,041 B1 | 8/2002 | Ryu et al. | |
| 6,448,160 B1 | 9/2002 | Chang et al. | |
| 6,455,892 B1 | 9/2002 | Okuno | |
| 6,551,865 B2 | 4/2003 | Kumar et al. | |
| 6,573,534 B1 * | 6/2003 | Kumar et al. | 257/77 |
| 6,593,620 B1 | 7/2003 | Hshieh et al. | |
| 6,610,366 B2 | 8/2003 | Lipkin | |
| 6,653,659 B2 | 11/2003 | Ryu et al. | |
| 6,759,684 B2 | 7/2004 | Kosugi et al. | |
| 6,767,843 B2 | 7/2004 | Lipkin et al. | |
| 2002/0038891 A1 | 4/2002 | Ryu et al. | |
| 2002/0047125 A1 | 4/2002 | Fukuda et al. | |
| 2002/0102358 A1 | 8/2002 | Das et al. | |
| 2003/0079676 A1 | 5/2003 | Ellison et al. | |
| 2004/0119076 A1 | 6/2004 | Ryu | |
| 2004/0211980 A1 | 10/2004 | Ryu | |
| 2004/0212011 A1 | 10/2004 | Ryu | |
| 2004/0222501 A1 | 11/2004 | Kordina | |
| 2005/0000406 A1 | 1/2005 | Janzen et al. | |
| 2005/0001217 A1 | 1/2005 | Kusumoto et al. | 257/77 |
| 2005/0020084 A1 | 1/2005 | Richtarch | 438/692 |
| 2005/0280004 A1 | 12/2005 | Das et al. | |

FOREIGN PATENT DOCUMENTS

| | | |
|---|---|---|
| DE | 19900171 | 7/1999 |
| DE | 10036208 | 2/2002 |
| EP | 1 058 317 A2 | 12/2000 |
| EP | 0 637 069 B1 | 1/2001 |
| EP | 1 204 145 A2 | 5/2002 |
| EP | 1 306 890 A | 5/2003 |
| EP | 1 306 890 A2 | 5/2003 |
| EP | 1 494 268 A2 | 1/2005 |
| JP | 01117363 | 5/1989 |
| JP | 03034466 | 2/1991 |
| JP | 03157974 | 7/1991 |
| JP | H07-176504 | 7/1995 |
| JP | 08264766 | 10/1996 |
| JP | 09205202 | 8/1997 |
| JP | 10-308510 A | 11/1998 |
| JP | 11191559 | 7/1999 |
| JP | 11238742 | 8/1999 |
| JP | 11261061 | 9/1999 |
| JP | 11266017 | 9/1999 |
| JP | 11274487 | 10/1999 |
| JP | 2000049167 | 2/2000 |
| JP | 2000082812 | 3/2000 |
| JP | 2000106371 | 4/2000 |
| JP | 2003-158076 A | 5/2003 |
| JP | 2003-234301 A | 8/2003 |
| JP | 2004-537162 | 12/2004 |
| JP | 2005-039257 A | 2/2005 |
| JP | 2006-116896 A | 4/2005 |
| JP | 2006-511961 A | 4/2006 |
| JP | 2006-524433 A | 10/2006 |
| WO | WO 97/08754 | 3/1997 |
| WO | WO 97/39486 | 10/1997 |
| WO | WO 98/02916 | 1/1998 |
| WO | WO 98/02924 | 1/1998 |
| WO | WO 00/13236 | 3/2000 |
| WO | WO 2004/061974 A2 | 7/2004 |

OTHER PUBLICATIONS

A.K, Agarwal, J.B. Casady, L.B. Rowland, W.F. Valek, and C.D. Branch, "1400 V 4H-SiC Power MOSFET's," *Materials Science Forums* vols. 264-268, pp. 989-992, 1998.

A.K. Agarwal, J.B. Casady, L.B. Rowland, W.F. Valek, M.H. White, and C.D. Branch, "1.1 kV 4H-SiC Power UMOSFET's," *IEEE Electron Device Letters*, vol. 18, No. 12, pp. 586-588, Dec. 1997.

A.K. Agarwal, N.S. Saks, S.S. Mani, V.S. Hegde and P.A. Sanger, "Investigation of Lateral RESURF, 6H-SiC MOSFETs," *Materials Science Forum*, vols. 338-342, pp. 1307-1310, 2000.

A.K. Agarwal, S. Seshadri, and L.B. Rowland, "Temperature Dependence of Fowler-Nordheim Current in 6H-and 4H-SiC MOS Capacitors," *IEEE Electron Device Letters*, vol. 18, No. 12, Dec. 1997, pp. 592-594.

A.V. Suvorov, L.A. Lipkin, G.M. Johnson, R. Singh and J.W. Palmour, "4H-SiC Self-Aligned Implant-Diffused Structure for Power DMOSFETs," *Materials Science Forum* vols. 338-342, pp. 1275-1278, 2000.

Agarwal et al. "A Critical Look at the Performance Advantages and Limitations of 4H-SiC Power UMOSFET Structures," *1996 IEEE ISPD and IC's Proc.*, May 20-23, 1996, pp. 119-122.

Baliga, Power Semiconductor Devices, Chapter 7, PWS Publishing, 1996.

Bhatnagar et al. "Comparison of 6H-SiC, 3C-SiC, and Si for Power Devices," *IEEE Transactions on Electron Devices*, vol. 40, No. 3, Mar. 1993, pp. 645-655.

Capano, M.A., et al., Ionization Energies and Electron Mobilities in Phosphorus-and Nitrogen-Implanted 4H-Silicon Carbide, IEEE ICSCRM Conference 1999, Research Triangle Park, North Carolina (Oct. 10-13, 1999).

(56) References Cited

OTHER PUBLICATIONS

D. Alok, E. Arnold, and R. Egloff, "Process Dependence of Inversion Layer Mobility in 4H-SiC Devices," *Materials Science Forum*, vols. 338-342, pp. 1077-1080, 2000.

Das, Mrinal K. Graduate thesis entitled, *Fundamental Studies of the Silicon Carbide MOS Structure*. Purdue University, 1999.

Dastidar, Sujoyita, A Study of P-Type Activation in Silicon Carbide, Thesis (Purdue University, May 1998).

Fukuda et al. "Improvement of $SiO_2$/4H-SiC Interface Using High-Temperature Hydrogen Annealing at Low Pressure and Vacuum Annealing," *Jpn J. App. Phys.* vol. 38, Apr. 1999, pp. 2506-2509.

G.Y. Chung, C.C. Tin, J.R. Williams, K. McDonald, M. Di Ventre, S.T. Pantelides, L.C. Feldman, and R.A. Weller, "Effect of nitric oxide annealing on the interface trap densities near the band edges in the 4H polytype of silicon carbide," *Applied Physics Letters*, vol. 76, No. 13, pp. 1713-1715, Mar. 2000.

G.Y. Chung, C.C. Tin, J.R. Williams, K. McDonald, R.K. Chanana, R.A. Weller, S.T. Pantelides, L.C. Feldman, O.W. Holland, M.K. Das, and J.W. Palmour, "Improved Inversion Channel Mobility for 4H-SiC MOSFETs Following High Temperature Anneals in Nitric Oxide," *IEEE Electron Device Letters*, vol. 22, No. 4, Apr. 2001.

J. Tan, J.A. Cooper, Jr., and Mr. R. Melloch, "High-Voltage Accumulation-Layer UMOSFETs in 4H-Sic," *IEEE Electron Device Letters*, vol. 19, No. 12, pp. 487-489, Dec. 1998.

J.B. Casady, A.K. Agarwal, L.B. Rowland, W.F. Valek, and C.D. Brandt, "900 V DMOS and 1100 V UMOS 4H-SiC Power FETs," *IEEE Device Research Conference*, Ft. Collins, CO Jun. 23-25, 1997.

J.N. Shenoy, J.A. Cooper and M.R. Meelock, "High-Voltage Double-Implanted Power MOSFETs in 6H-SiC," *IEEE Electron Device Letters*, vol. 18, No. 3, pp. 93-95, Mar. 1997.

K. Ueno and Tadaaki Oikawa, "Counter-Doped MOSFET's of 4H-SiC," *IEEE Electron Device Letters*, vol. 20, No. 12, pp. 624-626, Dec. 1999.

K. Ueno, R. Asai, and T. Tsuji. "4H-SiC MOSFET's Utilizing the H2 Surface Cleaning Technique," *IEEE Electron Device Letters*, vol. 19, No. 7, Jul. 1998, pp. 244-246.

L.A. Lipkin and J.W. Palmour, "Low interface state density oxides on p-type SiC," Materials Science Forum vols. 264-268, pp. 853-856, 1998.

Lipkin et al. "Insulator Investigation on SiC for Improved Reliability," *IEEE Transactions on Electron Devices*, vol. 46, No. 3, Mar. 1999, pp. 525-532.

Lipkin et al, "Challenges and State-of-the-Art Oxides in SiC," *Mat. Res. Soc. Symp. Proc.* vol. 640, 2001, pp. 27-29.

M. K. Das, L.A. Lipkin, J.W. Palmour, G.Y. Chung, J.R. Williams, K. McDonald, and L.C. Feldman, "High Mobility 4H-SiC Inversion Mode MOSFETs Using Thermally Grown, NO Annealed $SiO_2$," *IEEE Device Research Conference*, Denver, CO Jun. 19-21, 2000.

M.K. Das, J.A. Cooper, Jr., M.R. Melloch, and M.A. Capano, "Inversion Channel Mobility in 4H- and 6H-SiC MOSFETs," *IEEE Semiconductor Interface Specialists Conference*, San Diego, CA, Dec. 3-5, 1998.

Mondal et al, "An Integrated 500-V Power DSMOSFET/Antiparallel Rectifier Device with Improved Diode Reverse Recovery Characteristics," *IEEE Electron Device Letters*, vol. 23, No. 9, Sep. 2002, pp. 562-564.

Motorola Power MOSFET Transistor Databook, 4th edition, Motorola, INc., 1989, pp. 2-5-4-2-5-7.

P.M. Shenoy and B.J. Baliga, "The Planar 6H-SiC ACCUFET: A New High-Voltage Power MOSFET Structure," *IEEE Electron Device Letters*, vol. 18, No. 12, pp. 589-591, Dec. 1997.

Palmour et al. "SiC Device Technology: Remaining Issues," Diamond and Related Materials, vol. 6, 1997, pp. 1400-1404.

Patel, R., et al., Phosphorus-Implanted High-Voltage N.sup.+P 4H-SiC Junction Rectifiers, Proceedings of 1998 International Symposium on Poer Semiconductor Devices & ICs, pp. 387-390 (Kyoto).

R. Schörner, P. Friedrichs, D. Peters, H. Mitlehner, B. Weis, and D. Stephani, "Rugged Power MOSFETs in 6H-SiC with Blocking Capability up to 1800 V," *Materials Science Forum* vols. 338-342, pp. 1295-1298, 2000.

R. Schorner, P. Friedrichs, D. Peters, and D. Stephani, "Significantly Improved Performance of MOSFETs on Silicon Carbide Using the 15R-SiC Polytype," *IEEE Electron Device Letters*, vol. 20, No. 5, pp. 241-244, May 1999.

Ranbir Singh, Sei-Hyung Ryu and John W. Palmour, "High Temperature, High Current, 4H-SiC Accu-DMOSFET," Materials Science Forum vols. 338-342, pp. 1271-1274, 2000.

Rao et al, "Al and N Ion Implantations in 6H-SiC," Silicon Carbide and Related Materials. 1995 Conf, Kyoto, Japan, Published 1996.

Rao et al, "P-N Junction Formation in 6H-SiC by Acceptor Implantation into N-Type Substrate," Nuclear Instruments and Methods in Physics Research B, vol. 106, 1995, pp. 333-338.

Ryu at al. Article and Presentation: "27 $m\Omega \cdot cm^2$, 1.6 kV Power DiMOSFETs in 4H-SiC," *Proceedings of the 14 International Symposium on Power Semiconductor Devices & ICs 2002*, Jun. 4-7, 2002, Santa Fe, NM.

S. Sridevan and B. Jayant Baliga, "Lateral N-Channel Inversion Mode 4H-SiC MOSFET's," *IEEE Electron Device Letters*, vol. 19, No. 7, pp. 228-230, Jul. 1998.

S.T. Pantelides, "Atomic Scale Engineering of SiC Dielectric Interfaces," DARPA/MTO High Power and ONR Power Switching MURI Reviews, Rosslyn, VA, Aug. 10-12, 1999.

Sze, *Physics of Semiconductor Devices, Second Edition*, John Wiley & Sons, 1981, pp. 196-198 and 229-234.

V.R. Vathulya and M.H. White, "Characterization of Channel Mobility on Implanted SiC to Determine Polytype Suitability for the Power DIMOS Structure," *Electronic Materials Conference*, Santa Barbara, CA, Jun. 30-Jul. 2, 1999.

V.R. Vathulya, H. Shang, and M.H. White, "A Novel 6H-SiC Power DMOSFET with Implanted P-Well Spacer," *IEEE Electronic Device Letters*, vol. 20, No. 7, Jul. 1999, pp. 354-356.

Williams et al, "Passivation of the 4H-SiC/$SiO_2$ Interface with Nitric Oxide," *Materials Science Forum*. vols. 389-393 (2002), pp. 967-972.

Y. Wang, C. Weitzel, and M. Bhatnagar, "Accumulation-Mode SiC Power MOSFET Design Issues," *Materials Science Forum*, vols. 338-342, pp. 1287-1290.

U.S. Appl. No. 60/435,212, "Vertical JFET Limited Silicon Carbide Power Metal-Oxide Semiconductor Field Effect Transistors and Methods of Fabricating Vertical JFET Limited Silicon Carbide Power Metal-Oxide Semiconductor Field Effect Transistors," filed Dec. 20, 2002.

U.S. Appl. No. 60/294,307, "Method of $N_2O$ Growth on an Oxide Layer on a Silicon Carbide Layer," filed May 31, 2001.

U.S. Appl. No. 10/686,795, "Methods of Forming Power Semiconductor Devices Using Boule-Grown Silicon Carbide Drift Layers and Power Semiconductor Devices Formed Thereby," filed Oct. 16, 2003.

U.S. Appl. No. 11/052,679, "Process for Producing Silicon Carbide Crystals Having Increased Minority Carrier Lifetimes," filed Feb. 7, 2005 (Cree Docket No. P0475).

Examination Report, Communication Pursuant to Article 94(3) EPC, EP 06 738 542.7, Apr. 8, 2011.

Office Action, Japanese Patent Application No. 2008-513462, Nov. 15, 2011.

European Search Report Corresponding to Application No. 10196317.1; Dated: Dec. 27, 2011; 13 pages.

Office Action; Taiwan Patent Application No. 095109031, Jun. 18, 2012, 14 pages.

Office Action; Japan Patent Application No. 2008-513462, Aug. 28, 2012, 4 pages.

Office Action; Japan Patent Application No. 2012-111459, Jan. 14, 2014, 7 pages.

Office Action, Japanese Patent Application No. 2012-111459, Dec. 3, 2014.

\* cited by examiner

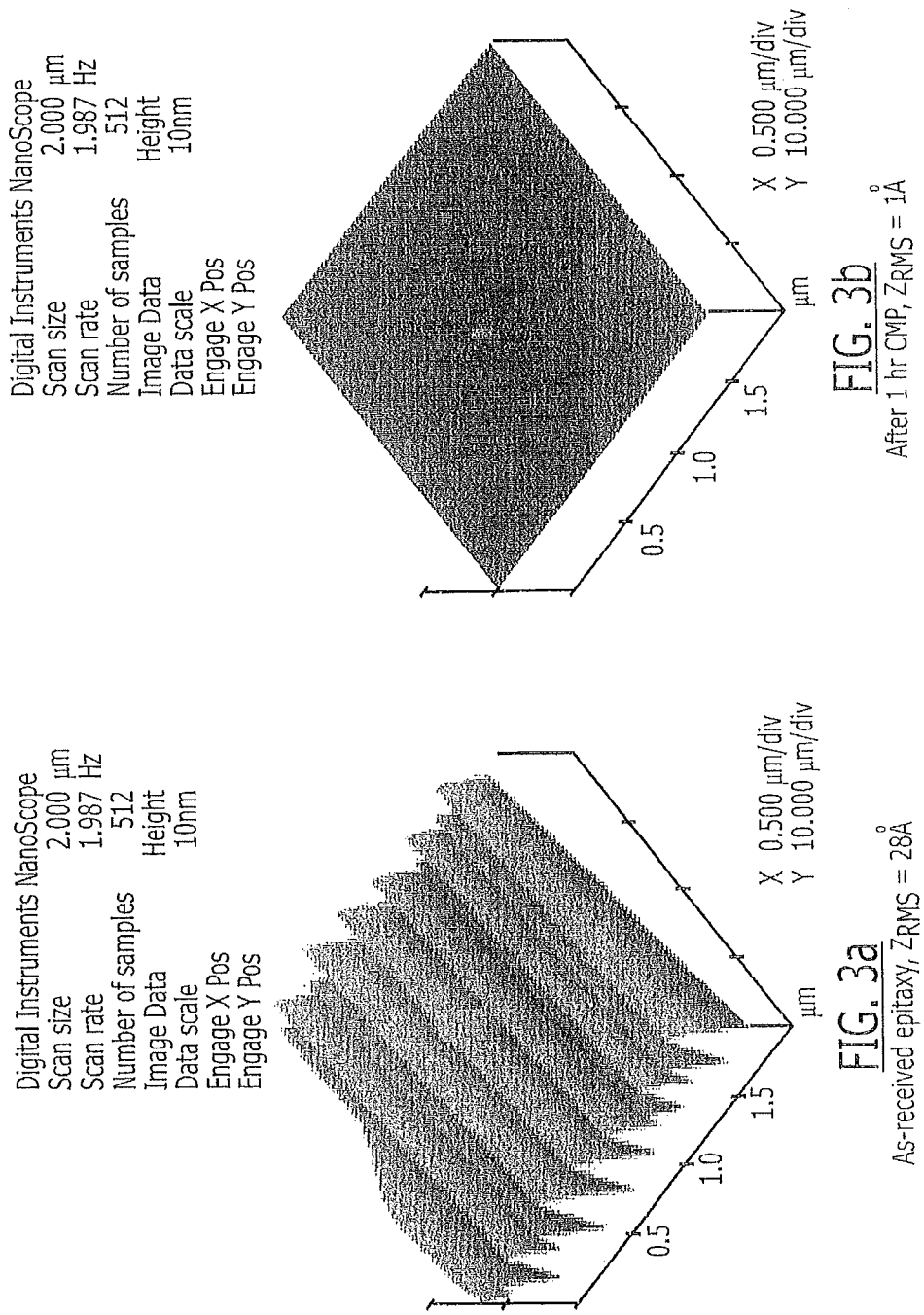

After CMP + Sac Ox, $Z_{RMS}$ = 0.7Å

SILICON CARBIDE DEVICES HAVING SMOOTH CHANNELS

CLAIM OF PRIORITY

This application is a divisional of U.S. application No. 13/470,600, filed May 14, 2012, now U.S. Pat. No. 8,859,366, which is a continuation of U.S. application Ser. No. 12/424,960, filed Apr. 16, 2009, now U.S. Pat. No. 8,188,483, which is a continuation of U.S. application Ser. No. 11/136,057, filed May 24, 2005, now U.S. Pat. No. 7,528,040, the disclosures of which are hereby incorporated herein by reference as if set forth in their entirety.

STATEMENT OF GOVERNMENT INTEREST

The present invention was developed with Government support under contract number FA8650-04-2-2410 awarded by the United States Air Force. The Government has certain rights in this invention.

FIELD

This invention relates to methods of fabricating power devices and the resulting devices and, more particularly, to power devices and methods of fabricating silicon carbide power devices.

BACKGROUND

Power devices are widely used to carry large currents and support high voltages. Modern power devices are generally fabricated from monocrystalline silicon semiconductor material. One widely used power device is the power Metal Oxide Semiconductor Field Effect Transistor (MOSFET). In a power MOSFET, a control signal is supplied to a gate electrode that is separated from the semiconductor surface by an intervening insulator, which may be, but is not limited to, silicon dioxide. Current conduction occurs via transport of majority carriers, without the presence of minority carrier injection that is used in bipolar transistor operation. Power MOSFETs can provide an excellent safe operating area, and can be paralleled in a unit cell structure.

As is well known to those having skill in the art, power MOSFETs may include a lateral structure or a vertical structure. In a lateral structure, the drain, gate and source terminals are on the same surface of a substrate. In contrast, in a vertical structure, the source and drain are on opposite surfaces of the substrate.

One widely used silicon power MOSFET is the double diffused MOSFET (DMOSFET), which is fabricated using a double-diffusion process. In these devices, a p-base region and an $n^+$ source region are diffused through a common opening in a mask. The p-base region is driven in deeper than the $n^+$ source. The difference in the lateral diffusion between the p-base and $n^+$ source regions forms a surface channel region. An overview of power MOSFETs including DMOSFETs may be found in the textbook entitled "*Power Semiconductor Devices*" by B. J. Baliga, published by PWS Publishing Company, 1996, and specifically in Chapter 7, entitled "*Power MOSFET*", the disclosure of which is hereby incorporated herein by reference.

Development efforts in power devices have also included investigation of the use of silicon carbide (SiC) devices for power devices. Silicon carbide has a wide bandgap, a lower dielectric constant, a high breakdown field strength, a high thermal conductivity, and a high saturation electron drift velocity compared to silicon. These characteristics may allow silicon carbide power devices to operate at higher temperatures, higher power levels and with lower specific on-resistance than conventional silicon-based power devices. A theoretical analysis of the superiority of silicon carbide devices over silicon devices is found in a publication by Bhatnagar et al. entitled "*Comparison of 6H-SiC, 3C-SiC and Si for Power Devices*", IEEE Transactions on Electron Devices, Vol. 40, 1993, pp. 645-655 . A power MOSFET fabricated in silicon carbide is described in U.S. Pat. No. 5,506,421 to Palmour entitled "Power MOSFET in Silicon Carbide" and assigned to the assignee of the present invention. Silicon Carbide power devices are also described in U.S. Pat. No. 6,107,142 to Suvorov et al., entitled Self-Aligned Methods of Fabricating Silicon Carbide Power Devices by Implantation and Lateral Diffusion and U.S. Pat. No. 6,100,169 to Suvorov et al., entitled Methods of Fabricating Silicon Carbide Power Devices by Controlled Annealing, both of which are assigned to the assignee of the present invention.

Notwithstanding these potential advantages, it may be difficult to fabricate power devices including power MOSFETs in silicon carbide. For example, as described above, the double-diffused MOSFET (DMOSFET) is generally fabricated in silicon using a double diffusion process wherein the p-base region is driven in deeper than the $n^+$ source. Unfortunately, in silicon carbide, the diffusion coefficients of conventional p and n-type dopants are small compared to silicon, so that it may be difficult to obtain the required depths of the p-base and $n^+$ source regions using acceptable diffusion times and temperatures. Ion implantation may also be used to implant the p-base and the $n^+$ source. See, for example, "*High-Voltage Double-Implanted Power MOSFET's in 6H-SiC*" by Shenoy et al., IEEE Electron Device Letters, Vol. 18, No. 3, March 1997, pp. 93-95 . However, it may be difficult to control the depth and lateral extent of ion implanted regions. Moreover, the need to form a surface channel surrounding the source region may require the use of two separate implantation masks. It may then be difficult to align the p-base and the source regions to one another, thereby potentially impacting the device performance.

Furthermore, performing a series implants and implant activation anneals may result in step bunched surfaces across the channel of the MOSFET, which may diminish device performance in terms of for example, increased on resistance and reduced reliability.

SUMMARY

Some embodiments of the present invention provide methods of forming silicon carbide power devices. An $n^-$ silicon carbide layer is provided on a silicon carbide substrate. A p-type silicon carbide well region is provided on the n silicon carbide layer. A buried region of $p^+$ silicon carbide is provided on the p-type silicon carbide well region. An $n^+$ region of silicon carbide is provided on the buried region of $p^+$ silicon carbide. A channel region of the power device is adjacent the buried region of $p^+$ silicon carbide and the $n^+$ region of silicon carbide. An $n^-$ region is provided on the channel region and a portion of the $n^-$ region is removed from the channel region so that a portion of the $n^-$ region remains on the channel region to provide a reduction in a surface roughness of the channel region.

In further embodiments of the present invention, a portion of the n region may be removed using a chemical mechanical polishing (CMP) process that removes a portion of the $n^-$ region from the channel region. The CMP process may remove all but from about 1000 to about 5000 Å of the $n^-$ region. A portion of the n⁻ region that is from about 2.0 to about 3.0 times a depth of the surface roughness of the channel region may be removed. In certain embodiments of the present invention about 1500 Å of the n⁻ region remains on the channel region after the CMP process.

In still further embodiments of the present invention, the reduction in the surface roughness may be a reduction in a root mean square (RMS) surface roughness of from at least about 28 Å to less than about 1.0 Å. A sacrificial oxide layer having a thickness of from about 100 to about 1000 Å may be formed on the remaining portion of the n⁻ region on the channel region and removed. The RMS surface roughness may be further reduced by the formation and removal of the sacrificial oxide layer from less than about 1.0 Å to about 0.70 Å.

In some embodiments of the present invention, the n⁻ region may be an n⁻ epitaxial layer that is grown on the channel region to a predetermined thickness such that a portion of the n⁻ epitaxial layer remains on the channel region after removal of a portion of the n⁻ epitaxial layer. In certain embodiments of the present invention, the predetermined thickness of the n⁻ epitaxial layer may be from about 1500 Å to about 5000 Å. The CMP process may be followed by selectively etching the n⁻ region such that the n⁻ region is removed from the n⁺ region.

In further embodiments of the present invention, the p-type silicon carbide well region may be formed by implanting p-type dopants in the n⁻ silicon carbide layer. The buried region of p⁺ silicon carbide may be formed by implanting p-type dopants in the p-type silicon carbide well region. The n⁺ region of silicon carbide may be formed by implanting n-type dopants in the p-type silicon carbide well region on the buried region of p⁺ silicon carbide. The implanted dopants may be activated by exposing the implanted dopants to a temperature of greater than about 1600° C.

In still further embodiments of the present invention, the p-type silicon carbide well region may be a p-type epitaxial layer on the n⁻ silicon carbide layer. The buried regions of p⁺ silicon carbide may be formed by implanting p-type silicon carbide dopants on the p-type silicon carbide well region. The n⁺ regions of silicon carbide may be formed by implanting n-type silicon carbide dopants in the p-type silicon carbide well region on the buried region of p⁺ silicon carbide.

In some embodiments of the present invention, an n-type region of silicon carbide may be formed in the p-type silicon carbide well region adjacent the channel region. The channel region may be defined between the buried region of p⁺ silicon carbide and the n-type region of silicon carbide. The n-type region of silicon carbide may be a Junction Field Effect Transistor (JFET) region of the silicon carbide power device.

In further embodiments of the present invention, an n-type region of silicon carbide may be formed in the p-type silicon carbide well region adjacent the channel region. The channel region may be defined between the buried region of p⁺ silicon carbide and the n-type region of silicon carbide. The n⁻ region may only remain on the channel region.

In still further embodiments of the present invention, the substrate may be an n⁻ substrate, which serves as a drift region of the silicon carbide power device. An n⁺ drain region may be provided on the substrate opposite the n⁻ silicon carbide layer. The n⁺ drain region may be an implanted region or an epitaxial region. In certain embodiments of the present invention, the silicon carbide power device may be a Metal Oxide Semiconductor Field Effect Transistor (MOSFET).

Some embodiments of the present invention provide methods of forming silicon carbide power devices. A silicon carbide epitaxial region is grown on a channel region of the power device. A portion of the silicon carbide epitaxial region is mechanically removed such that a remaining portion of the silicon carbide epitaxial region provides a reduction in a surface roughness of the channel region.

In still further embodiments of the present invention, the reduction in the surface roughness may be a reduction in the RMS surface roughness of from at least about 28 Å to less than about 1.0 Å. In certain embodiments of the present invention, a sacrificial oxide layer may be formed on the silicon carbide epitaxial region and the sacrificial oxide layer may be removed to provide a further reduction in the surface roughness of the channel region. The RMS surface roughness may be further reduced by the formation and removal of the sacrificial oxide layer from less than about 1.0 Å to about 0.70 Å.

Some embodiments of the present invention provide power devices including a p-type conductivity well region and a buried p⁺ conductivity region in the p-type conductivity well region. An n⁺ conductivity region is provided on the buried p⁺ conductivity region. A channel region of the power device is provided adjacent the buried p⁺ conductivity region and n⁺ conductivity region, the channel region of the power device having a root mean square (RMS) surface roughness of less than about 1.0 Å.

In further embodiments of the present invention, the p-type conductivity well region may be a p-type silicon carbide well region, the buried p⁺ conductivity region may be a buried region of p⁺ silicon carbide in the p-type silicon carbide well region and the n⁺ conductivity region may be an n⁺ region of silicon carbide on the buried region of p⁺ silicon carbide.

In still further embodiments of the present invention, a sacrificial oxide layer may be provided on a surface of the channel region having a thickness of from about 100 to about 1000 Å, wherein the RMS surface roughness of the channel region may be reduced to about 0.70 Å after formation of the sacrificial oxide layer.

In some embodiments of the present invention, an n⁻ silicon carbide region may be provided on the channel region of the power device. The presence of the n⁻ silicon carbide region may provide a reduction in a surface roughness of the channel region. The reduction in the surface roughness may be a reduction in a root mean square (RMS) surface roughness of from at least about 28 Å to less than about 1.0 Å.

In further embodiments of the present invention, the n⁻ region of silicon carbide on the channel region may have a thickness of from about 1000 to about 5000 Å and in some embodiments about 1500 Å.

In still further embodiments of the present invention, the n region may be a remaining portion of an n⁻ epitaxial layer on the channel region after removal of a removed portion of the n⁻ epitaxial layer. The n⁻ epitaxial layer may have a thickness of from about 1500 Å to about 6000 Å before removal of the removed portion thereof.

In some embodiments of the present invention, an n-type region of silicon carbide may be provided in the p-type silicon carbide well region adjacent the channel region, the channel region may be defined between the buried region of p⁺ silicon carbide and the n-type region of silicon carbide and the n⁻ region may only remain on the channel region.

In further embodiments of the present invention, the device may further include a silicon carbide substrate. The p-type silicon carbide well region may be provided on the silicon carbide substrate. An n⁻ silicon carbide layer may be provided between the silicon carbide substrate and the p-type silicon carbide well region. The p-type silicon carbide well region may be, an implanted region of p-type silicon carbide in the n silicon carbide layer. The buried region of p⁺ silicon carbide may be an implanted region of p+ silicon carbide in the p-type silicon carbide well region and the n+ region of silicon carbide may be an implanted n-type region in the p-type silicon carbide well region on the buried region of p+ silicon carbide.

In still further embodiments of the present invention, the device may further include a silicon carbide substrate. The p-type silicon carbide well region may be provided on the silicon carbide substrate. An n⁻ silicon carbide layer may be provided between the silicon carbide substrate and the p-type silicon carbide well region. The p-type silicon carbide well region may be a p-type epitaxial layer on the n⁻ silicon carbide layer, the buried region of p+ silicon carbide may be an implanted region of p-type silicon carbide in the p-type silicon carbide well region and the n+ region of silicon carbide may be an implanted region of n-type silicon carbide in the p-type silicon carbide well region on the p+ region of silicon carbide.

In some embodiments of the present invention, an n-type region of silicon carbide may be provided in the p-type silicon carbide well region adjacent the channel region, the channel region may be defined between the buried region of p+ silicon carbide and the n-type region of silicon carbide and the n-type region of silicon carbide may be a Junction Field Effect Transistor (JFET) region of the power device.

In further embodiments of the present invention, the device may further include a silicon carbide substrate. The p-type silicon carbide well region may be provided on the silicon carbide substrate. An n⁻ silicon carbide layer may be provided between the silicon carbide substrate and the p-type silicon carbide well region, the substrate may be an n⁻ substrate which serves as a drift region of the power device. The device may further include an n+ drain region on the substrate opposite the n⁻ silicon carbide layer. The n+ drain region may be an implanted n+ drain region in the n⁻ substrate or an epitaxial n+ drain region on the n⁻ substrate.

In still further embodiments of the present invention, the power device may be a Metal Oxide Semiconductor Field Effect Transistor (MOSFET).

Some embodiments of the present invention provide Metal Oxide Semiconductor Field Effect Transistors (MOSFETs) including a channel region having a root mean square (RMS) surface roughness of less than about 1.0 Å.

Further embodiments of the present invention provide power devices including a p-type conductivity well region and a buried p+ conductivity region in the p-type conductivity well region. An n+ conductivity region is provided on the buried p+ conductivity region and a channel region of the power device is adjacent the buried p+ conductivity region and n+ conductivity region. An n⁻ conductivity region is provided on the channel region of the power device, the presence of the n⁻ conductivity region providing a reduction in a surface roughness of the channel region

BRIEF DESCRIPTION OF THE DRAWINGS

FIGS. 3A through 3C are images of channels of MOSFETS fabricated using methods according to some embodiments of the present invention.

DETAILED DESCRIPTION OF EMBODIMENTS

Figure 1:
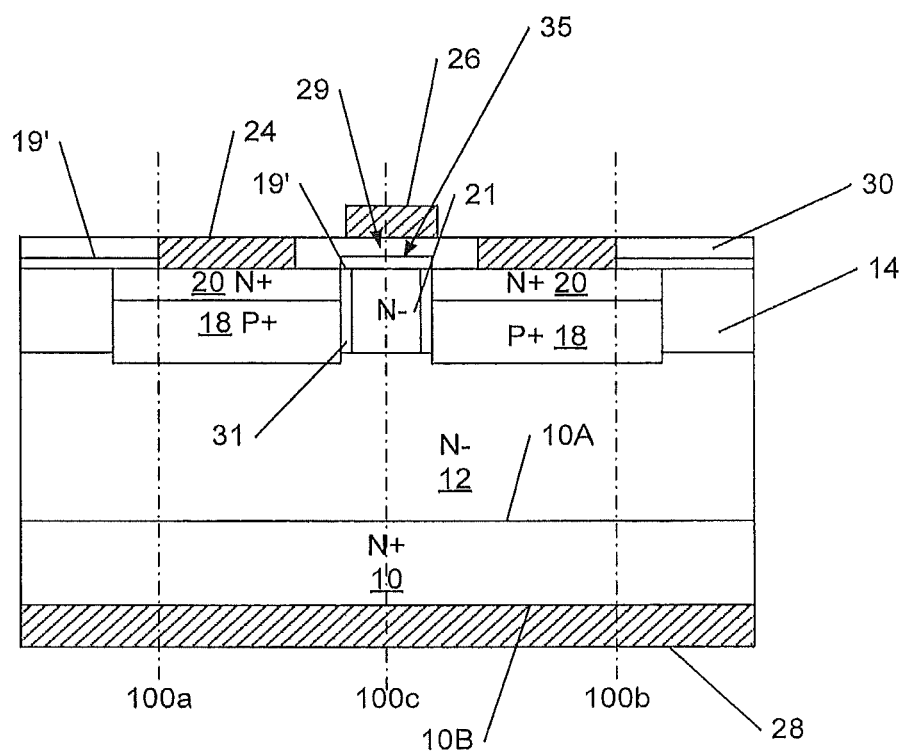
FIG. 1 is a cross section illustrating power MOSFETs according to some embodiments of the present invention.

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in the Figures is turned over, elements described as being on the "lower" side of other elements would then be oriented on "upper" sides of the other elements. The exemplary term "lower", can therefore, encompass both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Embodiments of the present invention are described herein with reference to cross-section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the precise shape of a region of a device and are not intended to limit the scope of the present invention.

Embodiments of the present invention are described with reference to a particular polarity conductivity type for various layers/regions. However, as will be appreciated by those of skill in the art, the polarity of the regions/layers may be inverted to provide an opposite polarity device.

Some embodiments of the present invention prevention provide power Metal Oxide Semiconductor Field Effect Transistors (MOSFETs) and/or other power devices that may include doped regions of silicon carbide. As is known to those of skill in the art, doped regions of silicon carbide may be formed through epitaxial growth and/or through implantation. For example, a p-type region of silicon carbide may be formed through epitaxial growth in the presence of a p-type dopant or through implantation of p-type dopants in an undoped, p-type or n-type epitaxial layer. The structure that results from epitaxial growth differs from that that results from implantation. Thus, the terms "epitaxial region" and "implanted region" structurally distinguish differing regions of silicon carbide and may be used herein as a recitation of structural characteristics of the regions of silicon carbide and/or as recitations of methods of forming such regions of silicon carbide.

While embodiments of the present invention are described with reference to MOSFETs, embodiments of the present invention may be used in other devices, such as laterally-diffused MOSFETs (LDMOSFETs), Insulated Gate Bipolar Transistors (IGBTs) or other such MOS based devices as well as high voltage devices, such as Schottky and PiN diodes without departing from the scope of the present invention.

Surface morphology is a concern in the development of commercial silicon carbide (SiC) power devices, such as SiC power MOSFETs. The series of implantation steps and implant activation anneals may result in step-bunched surfaces across a channel of the device. The steps created on the surface of the device may be several hundred angstroms, which may cause increased on resistances and reduced reliability of the device. Methods according to some embodiments of the present invention may provide channel regions having reduced surface roughness so as to improve overall device performance. In particular, methods of fabricating power devices according to some embodiments of the present invention may provide an additional n⁻ region on the channel region. In particular, an n⁻ region may be formed on the channel region of the device, a portion of which is removed, such that a remaining portion of the n⁻ region on the channel region provides a reduced surface roughness of the channel region. Thus, at least a portion of the step-bunched surface may be removed from the channel region to provide a smoother channel region, i.e., a channel region with reduced surface roughness. In some embodiments, the removal process is performed using a chemical mechanical polishing process that may remove a portion of, or from about 1200 Å to about 1400 Å, of the n⁻ region from the channel region. The remaining portion of the n⁻ region may provide a reduction in a root mean square (RMS) surface roughness of the channel region of from about at least 28 Å to less than about 1.0 Å as will be discussed further below with respect to FIGS. 1 through 4.

Referring now to FIG. 1, a cross section illustrating embodiments of a vertical power MOSFET according to some embodiments of the present invention will be discussed.

It will be understood by those having skill in the art that the vertical silicon carbide MOSFETs are generally replicated in a unit cell. Such unit cells are illustrated between lines 100a and 100c or lines 100b and 100c, For ease of illustration, a two unit cell MOSFET will be described, however, as will be appreciated by those of skill in the art, additional unit cells may be incorporated into a MOSFET along one direction or along two, generally orthogonal directions, without departing from the scope of the present invention.

As illustrated in FIG. 1, a MOSFET according to some embodiments of the present invention includes an n⁺ monocrystalline silicon carbide substrate 10, for example, 4H silicon carbide. An n⁻ silicon carbide layer 12 is provided on a first face 10A of the substrate 10. As used herein, "p⁺" or "n⁺" refer to regions that are defined by higher carrier concentrations than are present in adjacent or other regions of the same or another layer or substrate. Similarly, "p⁻" or "n⁻" refer to regions that are defined by lower carrier concentrations than are present in adjacent or other regions of the same or another layer or substrate.

In some embodiments of the present invention, an n⁻ substrate could serve as an n⁻ drift layer of the device. In these embodiments of the present invention, an n⁺ drain region may be provided on a second face 10B of the n⁻ substrate. The n⁺ drain region may be provided by ion implantation or epitaxial growth without departing from the scope of the present invention.

A p-type silicon carbide region 14 is provided on the n⁻ silicon carbide layer 12 and may provide a p-well region of the MOSFET. It will be understood that the p-well region may be an epitaxial region or an implanted region without departing from the scope of the present invention.

A buried region 18 of p⁺ silicon carbide is provided in the p-well region 14 beneath an n⁺ region 20 of silicon carbide that is also provided in the p-type region 14. The n⁺ region 20 may provide a source region of the device. Adjacent and spaced apart from the n⁺ source region 20 is an n-type silicon carbide region 21 that extends through the p-well region 14 to the n⁻ silicon carbide layer 12. It will be understood that in embodiments of the present invention where the p-well region 14 is an epitaxial layer, the n-type silicon carbide region 21 may be termed a Junction Field Effect Transistor (JFET) region of the device.

The n-type silicon carbide region 21 may provide a portion of an n-type channel region 29. A surface of the n-type silicon carbide region 21 may include unwanted steps of up to several hundred angstroms each, which may cause increased on resistances and reduced reliability of the device. Furthermore, a surface of the p-type region 31 between the n-type silicon carbide region 21 and the buried region 18 of p⁺ silicon carbide may also include these unwanted steps. Thus, as illustrated in FIG. 1, an n⁻ region 19' according to some embodiments of the present invention may be provided on the n-type silicon carbide region 21 and the p-type region 31, which may form a channel region 29 of the device. In particular, an n-type epitaxial layer may be regrown on the n-type silicon carbide region 21, the p-type region 31 and other surfaces of the structure and selectively removed such that a portion of the n⁻ region 19' remains on the n-type silicon carbide region 21 and the p-type region 31 of the device, but is removed from the n⁺ source regions 20 as will be discussed further below with respect to FIGS. 2A through 2J.

Regrowth is discussed in detail in commonly assigned United States Patent Application Publication No. US 2004/0211980 entitled Silicon Carbide Power Devices With Self-Aligned Source And Well Regions and Methods Of Fabricating Same, filed on Apr. 24, 2003; United States Patent Application Publication No. US 2004/0119076 entitled Vertical JFET Limited Silicon Carbide Power Metal-Oxide Semiconductor Field Effect Transistors and Methods of Fabricating Vertical JFET Limited Silicon Carbide Metal-Oxide Semiconductor Field Effect Transistors, filed on Oct. 30, 2003; and United States Patent Application Publication No. US 2002/0038891 entitled Silicon Carbide Power Metal-Oxide Semiconductor Field Effect Transistors Having a Shorting Channel and Methods of Fabricating Silicon Carbide Metal-Oxide Semiconductor Field Effect Transistors Having a Shorting Channel, filed Jun. 24, 2001, the disclosures of which are hereby incorporated herein by reference as if set forth in their entirety.

The presence of the n$^-$ region 19' on the n-type silicon carbide region 21 and the p-type region 31 may provide a reduction in a surface roughness of the channel region 29 (a combination of the n-type silicon carbide region 21, the p-type region 31 and the remaining portion of the n– region 19'). In other words, the n$^-$ region 19' may fill in some of the peaks and valleys on the surface of the n-type silicon carbide region 21 and the p-type region 31 to provide a smoother interface 35 between the channel region 29 and the gate insulating layer 30 (discussed below). According to some embodiments of the present invention, the channel region 29 may have a root mean square (RMS) surface roughness of less than about 1.0 Å. Thus, according to some embodiments of the present invention, a reduction in the RMS surface roughness of from at least about 28 Å to less than about 1.0 Å may be obtained, which will be discussed further below with respect to FIGS. 2A through 3C. According to some embodiments of the present invention, an optional sacrificial oxide layer (not shown) may be provided on a surface of the channel region 29 and subsequently removed. The sacrificial oxide layer may have a thickness of from about 100 to about 1000 Å, for example 500 Å. The formation and removal of the sacrificial oxide layer may further reduce the RMS surface roughness of the surface of the channel region 29 to about 0.70 Å.

A gate insulating layer 30 of a suitable dielectric material, such as silicon dioxide (SiO$_2$), extends over the channel region 29 and to the n$^+$ source regions 20. A gate contact 26 is provided on the gate layer opposite the channel region 29, including the n-type silicon carbide region 21, the p-type region 31 and the n– region 19'. Source contact 24 is provided between the n$^+$ source regions 20 and a drain contact 28 is provided on a second face 10B of the substrate 10 opposite the p-type region 14.

It will be understood that although embodiments of the present invention are discussed with respect to the MOSFET structure illustrated in FIG. 1, embodiments of the present invention are not limited to this configuration. For example, in some embodiments of the present invention, the MOSFET may include a hybrid well structure as described in commonly assigned U.S. patent application Ser. No. 10/873,394, filed Jun. 22, 2004, entitled Silicon Carbide Devices With Hybrid Well Regions And Methods Of Fabricating Silicon Carbide Devices With Hybrid Well Regions, the disclosure of which is incorporated herein by reference as if set forth fully herein.

Figure 2A:
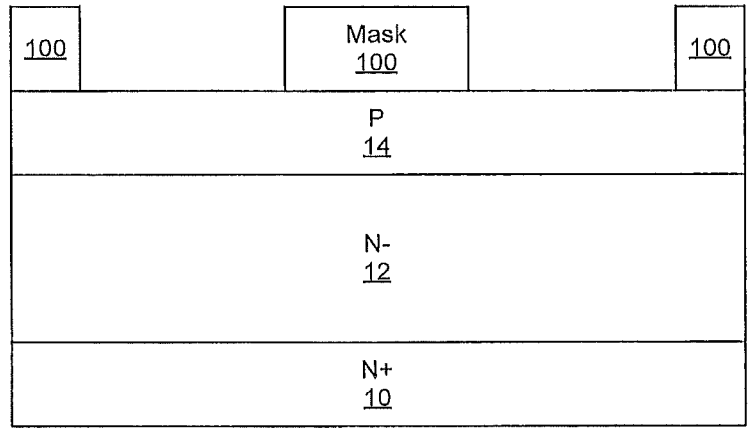
FIGS. 2A through 2J are cross sections illustrating processing steps in the fabrication of the power MOSFETs of FIG. 1 according to some embodiments of the present invention.

Referring now to FIGS. 2A through 2J, processing steps in the fabrication of power devices, for example, MOSFETs, according to some embodiments of the present invention will be discussed. As illustrated in FIG. 2A, an n$^-$ epitaxial layer 12 is formed on an n$^+$ silicon carbide substrate 10, for example, a 4H silicon carbide substrate. The n$^-$ layer 12 may have a thickness of from about 5 to about 200 µm and a doping to provide a carrier concentration of from about 1×10$^{14}$ cm$^{-3}$ to about 1×10$^{17}$ cm$^{-3}$. In particular embodiments of the present invention, the n– layer 12 is about 12 µm thick and is doped to provide a carrier concentration of about 5×10$^{15}$ cm$^{-3}$.

A p-type layer 14 is provided on the n$^-$ epitaxial layer 12. As discussed above, the p-type layer 14 may provide a p-well region of the device. The p-type layer 14 may be an epitaxial region or an implanted region without departing from the scope of the present invention. In particular, in embodiments of the present invention where the p-type layer 14 is an implanted region, p-type silicon carbide dopants may be implanted in the n$^-$ layer 12 to provide the p-type layer 14. In embodiments of the present invention where the p-type layer 14 is an epitaxial layer, the p-type layer 14 may be grown on the n$^-$ layer 12. The p-type layer 14 may have a thickness of from about 0.5 to about 3 µm and a doping to provide a carrier concentration of from about 2×10$^{16}$ cm$^{-3}$ to about 5×10$^{17}$ cm$^{-3}$. In particular embodiments of the present invention, the p-type layer 14 is about 0.5 µm thick and is doped to provide a carrier concentration of about 1×10$^{16}$ cm$^{-3}$. As further illustrated in FIG. 2A, a mask layer 100 is formed on the p-type layer 14 and patterned to form openings corresponding to the source regions 20 and the buried p-type regions 18 of the device.

Figure 2B:
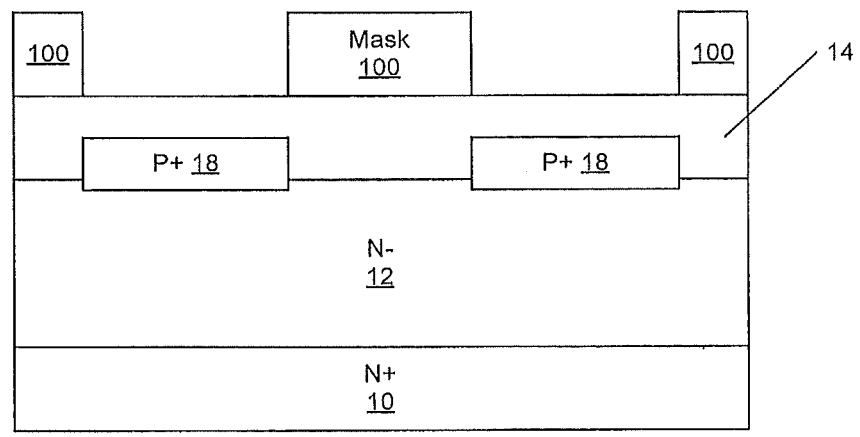
Figure 2C:
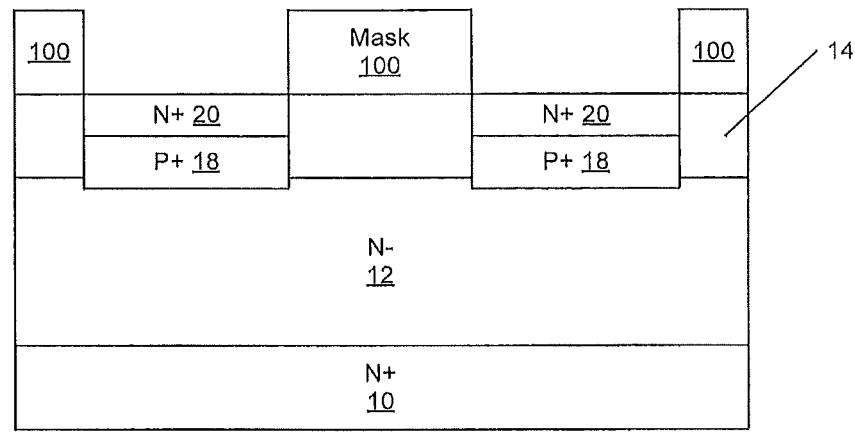

As illustrated in FIGS. 2B and 2C, the buried p-type regions 18 and the source regions 20 may be formed by patterning a mask layer 100 having openings corresponding to the location of the source regions 20. The buried p-type regions 18 are formed by ion implantation of p-type dopants using the patterned mask 100. The buried p-type regions 18 may extend to and, in some embodiments, into the drift region, for example, n$^-$ layer 12. The p-type dopant may be, for example, aluminum or other suitable p-type dopant. In certain embodiments of the present invention, the p-type region 18 has a thickness of less than about the thickness to which the region 21 may be formed, for example, from about 0.2 µm to about 1 µm. In particular embodiments of the present invention, the buried p-type regions 18 extend from a depth of about 0.2 µm to a depth of about 0.7 µm from the surface of the p-type layer 14. Furthermore, the p-type region 18 may be doped to provide a carrier concentration of from about 1×10$^{17}$ cm$^{-3}$ to about 1×10$^{18}$ cm$^{-3}$.

As illustrated in FIG. 2C, the source regions 20 are formed by implanting n-type dopants into the p-type layer 14 utilizing the patterned mask 100. The n-type dopant used for n-type implants may be, for example, nitrogen and/or phosphorus; however, other n-type dopants may also be used. The n-type source regions 20 may extend a distance of from about 0.2 µm to about 0.3 µm into the p-type layer. The n-type source regions 20 may be doped to provide a carrier concentration sufficient to allow for formation of a good ohmic contact. As used herein the term "ohmic contact" refers to contacts where an impedance associated therewith is substantially given by the relationship of Impedance=V/I, where V is a voltage across the contact and I is the current, at substantially all expected operating frequencies (i.e., the impedance associated with the ohmic contact is substantially the same at all operating frequencies) and currents, In particular embodiments of the present invention, the n-type source regions extend to a depth of about 0.2 µm into the p-type layer and are doped to provide a carrier concentration of at least from about 1×10$^{19}$ cm$^{-3}$ to about 1×10$^{20}$ cm$^{-3}$.

While embodiments of the present invention are described herein using the same windows in the patterned mask 100 for implantation of both the p-type regions 18 and the source regions 20, in some embodiments of the present invention different size windows may be used to compensate for straggle in the implantation.

Figure 2D:
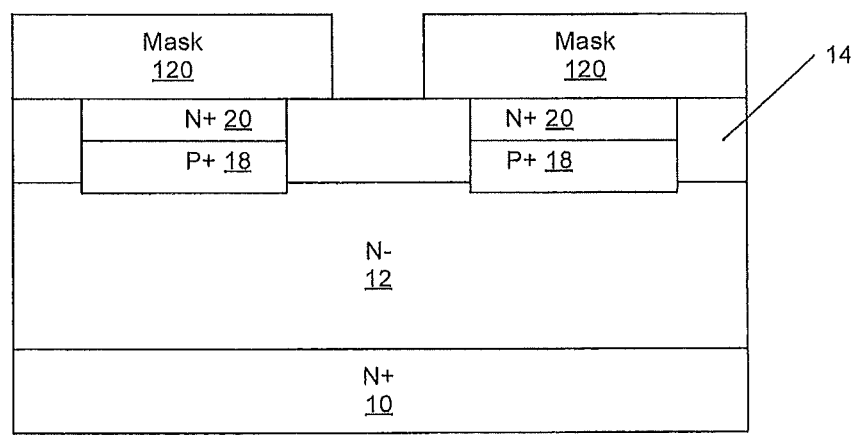
Figure 2E:
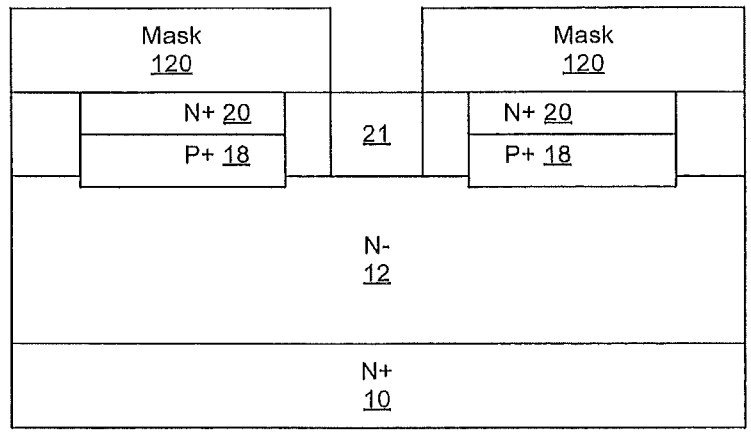

As illustrated in FIGS. 2D through 2E, the mask 100 may be removed and an n-type silicon carbide region 21 of the device may be provided in the p-well region 14. The n-type silicon carbide region 21 may be an implanted region or an epitaxial region without departing from the scope of the present invention. In embodiments of the present invention where the n-type silicon carbide region 21 is an implanted region, a second mask layer 120 may be patterned to have opening corresponding to the n-type silicon carbide region 21 of the device as illustrated in FIG. 2D. It will be understood that in embodiments of the present invention where the p-well region 14 is an epitaxial layer, the n-type silicon carbide region 21 may be termed a Junction Field Effect Transistor (JFET) region of the device.

As illustrated in FIG. 2E, the n-type silicon carbide region 21 may be formed by implanting n-type dopants in the p-type layer 14 utilizing the patterned mask 120 so as to form the n-type silicon carbide region 21 that extends through the p-type layer 14 to the drift region, for example, the n-type epitaxial layer 12. Any suitable n-type dopants may be used. In some embodiments of the present invention, nitrogen is used as the n-type dopant.

When the device is turned-on, the n-type region 21 can provide a path from the MOS channel to the lightly doped drift region (12), allowing electrons to flow from source regions to drain regions. In the off-state, this n-channel region may be depleted of electrons from the reverse biased pn junction, which is formed on both sides of the channel region. The pn-junctions on both sides of the channel region may shield the MOS region from high electric fields at off state, which may result in a higher device reliability compared to trench devices, such as UMOSFETs.

Figure 2F:
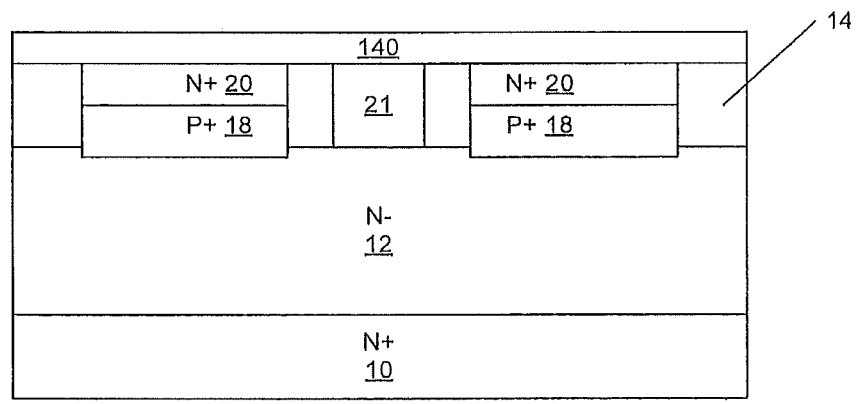

FIG. 2F illustrates the formation of an optional cap layer 140 of a deposited oxide and/or other passivating material. The cap layer 140 may have a thickness of from about 0.01 μm to about 1 μm. In any event, whether a cap layer 140 is utilized or not, the device may be exposed to a high temperature anneal ranging from about 900° C. to about 1800° C. and in some embodiments, about 1600° C. for several minutes, such as five minutes, so as to activate the n-type and p-type implants.

Figure 2G:
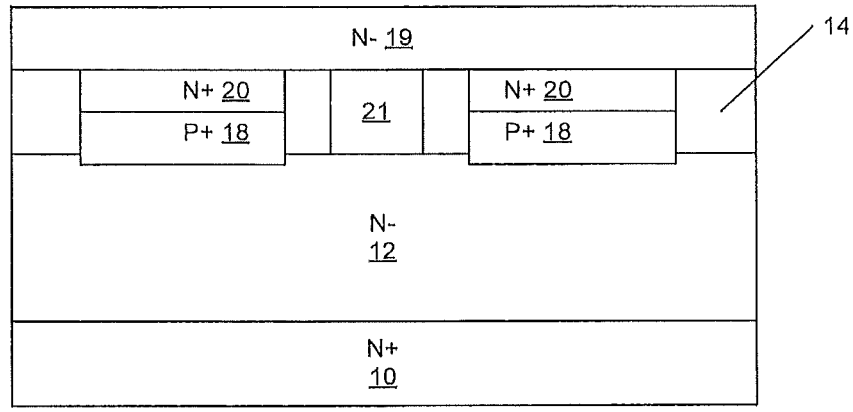

As illustrated in FIG. 2G, the cap layer 140 may be removed and an n$^-$ silicon carbide epitaxial region 19 may be formed on the channel region 29 of the device. A depth of the n$^-$ silicon carbide epitaxial region 19 may be controlled so that only a portion of the n$^-$ region 19 may be removed from the channel region 29 in a subsequent processing step. In some embodiments of the present invention, the n$^-$ silicon carbide region may have a thickness of from about 1500 Å to about 6000 Å and a carrier concentration of about $5 \times 10^{15}$ cm$^{-3}$.

Figure 2H:
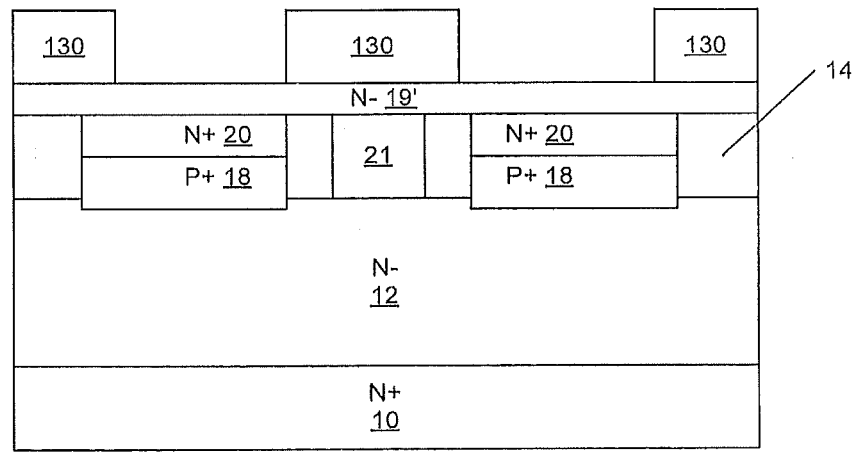

As illustrated in FIG. 2H, a portion of the n$^-$ region 19 is removed. The portion of the n$^-$ region 19' that remains on the n-type silicon carbide region 21 and the p-type region 31 may define the channel region 29 (FIG. 2I) of the device. The remaining portion of the n$^-$ region 19' may have a thickness of from about 1000 to about 5000 Å. In some embodiments of the present invention, the remaining portion of the n$^-$ region 19' may have a thickness of from about 1500 Å. The presence of the remaining portion of the n$^-$ region 19' on the channel region 29 may provide a reduction in a surface roughness of the channel region 29 at an interface 35 between the n– region 19' and the gate insulator 30, which will be discussed further below with respect to FIG. 3.

It will be understood that that the channel region 29 may be defined by the remaining portion of the n$^-$ region 19' and the portion of the p-well 31 between the n-type silicon carbide region 21 and the buried p-type regions 18 and the source regions 20. Accordingly, the n– region 19' may only remain on the portions of the p-well 31 between the n-type silicon carbide region 21 and the buried p-type regions 18 and the source regions 20 and not on the n-type silicon carbide region 21 without departing from the scope of the present invention.

In some embodiments of the present invention, a chemical mechanical polishing (CMP) process may be performed that removes a portion of the n$^-$ region 19 from a surface of the channel region 29. In certain embodiments of the present invention, the CMP process may remove a portion of the n– region 19 that is from about 2.0 to 3.0 times a depth of the surface roughness of the channel region 29. It will be understood that any conventional CMP process may be used as the CMP process discussed herein without departing from the scope of the present invention. However, the process discussed herein does not remove the entire n$^-$ region 19. Typically, implanted regions have a thickness of a few thousand angstroms and conventional CMP processes remove several microns of film during the CMP process to obtain the desired result. However, as will be understood by those having skill in the art, removal of several microns of film from the structure of FIG. 2G would remove all of the implanted region rendering the device non-functional.

Figure 2I:
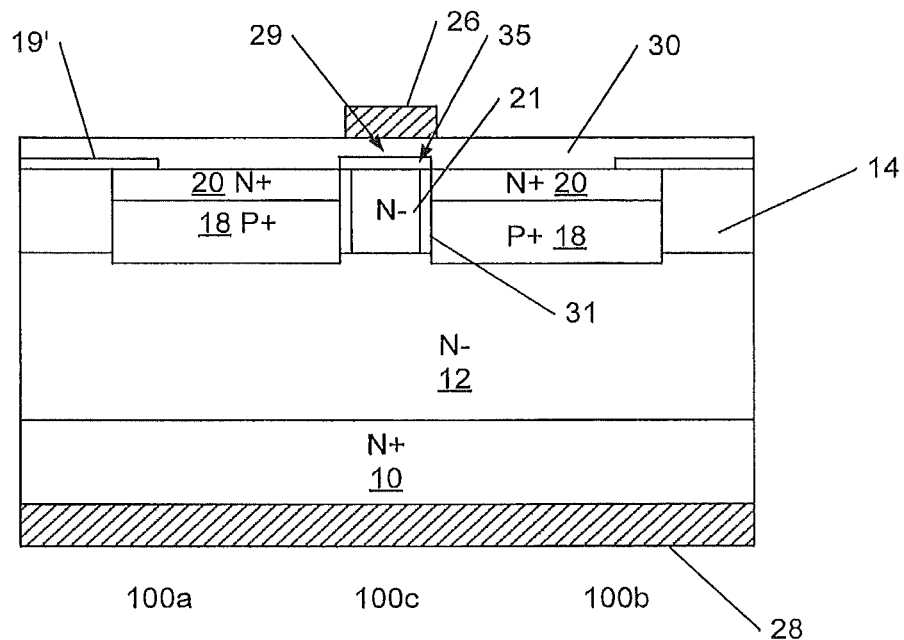

Accordingly, some embodiments of the present invention use a CMP process that removes a portion of the n$^-$ region 19, leaving a portion of the n$^-$ region 19' remaining on the channel region 29. For example, in some embodiments of the present invention, the CMP process may be performed for less than about 3 hours, for example, from about half an hour to about an hour. In other words, after the CMP process from about 1000 to about 5000 Å of the n$^-$ region 19 may remain on the channel region 29 of the device. Thus, the remaining portion of the n$^-$ region may be from about 1000 to about 5000 Å. The remaining portion of the n$^-$ region 19' on the n-type silicon carbide region 21 and the p-well region 31 become part of the channel region 29, i.e., the remaining portion of the n– region 19' may fill in the peaks and valleys on a surface of the n-type silicon carbide region 21 and the p-well region 31. As further illustrated in FIG. 2I1, a mask 130 may be provided on the remaining portion of the n$^-$ region 19' and the n$^-$ region 19' may be patterned according to the mask 130, removing portions of the n$^-$ region 19' on the source regions 20 as illustrated in FIG. 2I. As discussed above, in some embodiments of the present invention the n– region 19' may only remain on the p-well region 31 between the n-type silicon carbide region 21 and the source regions 20 and the buried p-type regions 18.

Figure 3C:
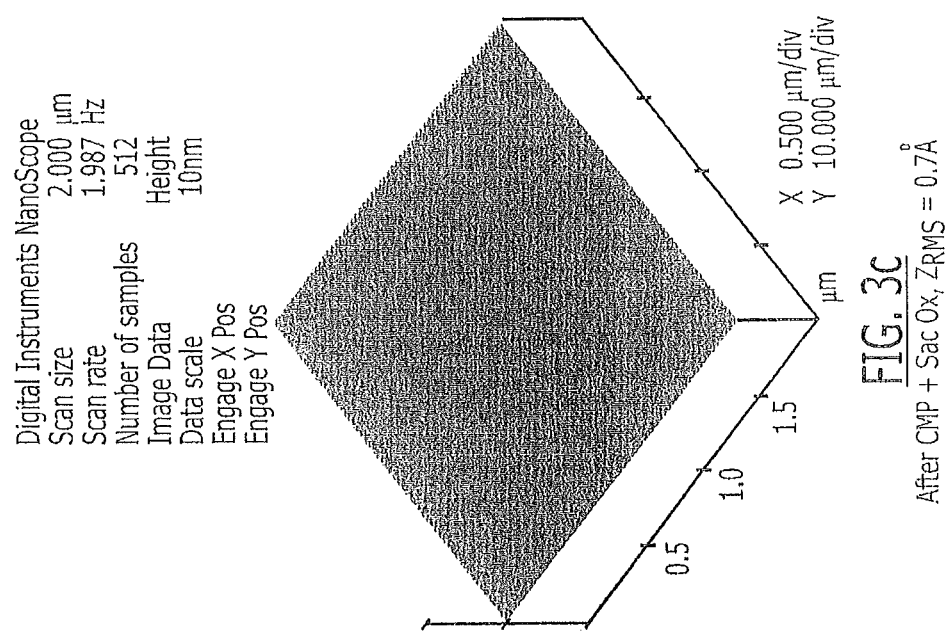

As discussed above, providing the n$^-$ region 19' on the n-type region 21 and the p-well region 31 may provide a reduction in the surface roughness between the n– region 19' and the gate insulator 30. For example, as illustrated in FIG. 3A, the surface of the n-type silicon carbide region 21 and the p-well region 31 may have many peaks and valleys after the anneal that activates the implanted regions. These peaks and valleys (several 100 angstroms) may cause suboptimal performance of the device. After the forming of the n$^-$ region 19 on the n-type silicon carbide region 21 and the p-well region 31 and the removal of a portion of the n$^-$ region from the n-type silicon carbide region 21 and the p-well region 31 according to some embodiments of the present invention, many of the peaks and valleys may be removed by the presence of the remaining portion of the n$^-$ region 19' as illustrated in FIG. 3B. In particular, the root mean square (RMS) surface roughness of the channel region 29 may be reduced from at least about 28 Å in FIG. 3A to less than about 1.0 Å in FIG. 3B according to some embodiments of the present invention. Furthermore, in some embodiments of the present invention, an optional sacrificial oxide layer (not shown) may be formed on a surface of the channel region 29 and removed. The formation and removal of the sacrificial oxide layer may further reduce the RMS surface roughness to about 0.70 Å as illustrated in FIG. 3C.

As illustrated in FIG. 2I, a layer 30 of insulating material may be deposited on the device so as to provide a gate insulating material. In some embodiments of the present invention, the insulating material may be formed as described in U.S. Pat. No. 6,610,366, entitled Method of $N_2O$ annealing an oxide layer on a silicon carbide layer, U.S. Pat. No. 6,767,843, entitled Method of $N_2O$ growth of an oxide layer on a silicon carbide layer and/or United States Patent Application Publication No. US2002/0102358A1, entitled Method of fabricating an oxide layer on a silicon carbide layer utilizing an anneal in a hydrogen environment, the disclosures of which are incorporated herein as if set forth in their entirety. In certain embodiments of the present invention, the insulating material may be formed as described in Improved Inversion Channel Mobility for 4H-SiC MOSFETs Following High Temperature Anneals in Nitric Oxide to Chung et al., the disclosure of which is incorporated herein by reference as if set forth in its entirety. As further illustrated in FIG. 2I, a gate contact 26 may be formed by forming a metal contact on the gate insulating material 30. Suitable gate contact materials include, but are not limited to, aluminum, polysilicon and molybdenum. Furthermore, as will be appreciated by those of skill in the art, a multi-layered gate contact may also be used.

Figure 2J:
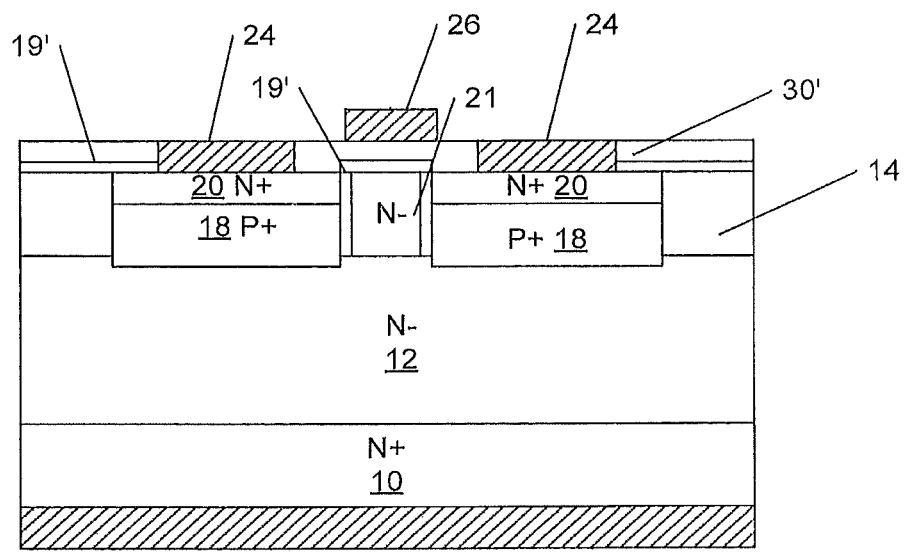

As is illustrated in FIG. 2J, contact holes may be formed in the insulating material 30' and ohmic contacts may be formed in the contact holes to provide source contacts 24. Similarly, an ohmic contact 28 may be formed on the substrate 10. Suitable ohmic contact materials include, but are not limited to, nickel, titanium alloy, and aluminum. The deposited metal contacts may then be annealed at a high temperature ranging from about 500° C. to about 1200° C. An overlayer metal may also be deposited on the contacts, for example, to facilitate connection to the device.

It will be understood by those having skill in the art that the order of steps in FIGS. 2A through 2J may be changed. Thus, for example, the n-type silicon carbide region 21 may be formed before forming the $n^+$ regions 20 without departing from the scope of the present invention. Similarly, the buried $p^+$ regions 18 may be formed either before or after formation of the $n^+$ regions 20 or the n-type silicon carbide region 21. Similarly, the contacts 24 may be formed by, for example, depositing and patterning a metal layer, and then the insulating layer 30' provided and openings in the insulating layer formed to the contacts 24. Accordingly, the present invention should not be construed as limited to the exact sequence of operations described herein but is intended to encompass other sequences of fabrication that will become apparent to those of skill in the art in light of the present disclosure.

Figure 4:
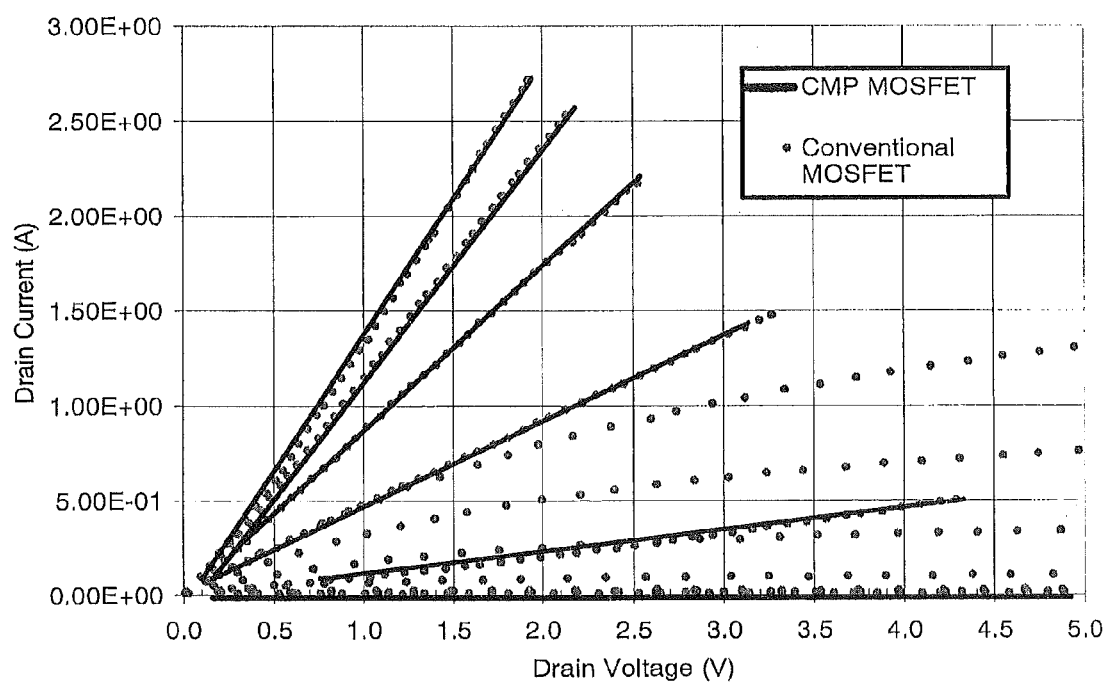
FIG. 4 is a chart illustrating a comparison of Drain Voltage (V) vs. Drain Current (A) for conventional devices and devices fabricated using methods according to some embodiments of the present invention.

Referring now to FIG. 4, a chart illustrating a comparison of Drain Voltage (V) vs. Drain Current (A) for conventional devices and devices fabricated using methods according to some embodiments of the present invention will be discussed. As illustrated in FIG. 4, the drain currents of MOSFETs fabricated according to some embodiments of the present invention are higher than conventional MOSFETS at relative drain voltages.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A silicon carbide power device, comprising:
an n-type silicon carbide region;
a p-type silicon carbide region adjacent the n-type silicon carbide region; and
an $n^-$ silicon carbide region that provides a reduction in surface roughness of a channel region of the silicon carbide power device,
wherein the n-type silicon carbide region and p-type silicon carbide region include steps of up to several hundred angstroms in height on surfaces thereof; and
wherein the $n^-$ silicon carbide region is provided on the steps on the surfaces of the n-type silicon carbide region and p-type silicon carbide region, the presence of the $n^-$ silicon carbide region on the steps providing the reduction in surface roughness of the channel region of the silicon carbide power device.

2. The device of claim 1, wherein the reduction in the surface roughness is a reduction in a root mean square (RMS) surface roughness of from at least about 28 Å to less than about 1.0 Å.

3. The device of claim 1, wherein the channel region of the silicon carbide power device has a root mean square (RMS) surface roughness of less than about 1.0 Å.

4. The device of claim 1, further comprising a gate insulating layer on the n-type silicon carbide layer and the p-type silicon carbide region, wherein the $n^{31}$ silicon carbide region fills in peaks and valleys on the surfaces of the n-type silicon carbide layer and the p-type silicon carbide region to provide a smoother interface between the channel region and a gate insulating layer.

5. The device of claim 1, wherein the $n^{31}$ silicon carbide region has a thickness of from about 1000 to about 5000 Å.

6. The device of claim 1, wherein the channel region of the silicon carbide includes the n-type silicon carbide region, the p-type silicon carbide region and the $n^-$ silicon carbide region.

7. The device of claim 1, further comprising a sacrificial oxide layer on the channel region, wherein the presence and removal of the sacrificial oxide layer further reduces the RMS surface roughness of the channel region.

8. The device of claim 7, wherein the RMS surface roughness of the surface of the channel region is no greater than about 0.7 Å.

* * * * *

UNITED STATES PATENT AND TRADEMARK OFFICE
CERTIFICATE OF CORRECTION

PATENT NO. : 9,142,663 B2
APPLICATION NO. : 14/482137
DATED : September 22, 2015
INVENTOR(S) : Das et al.

It is certified that error appears in the above-identified patent and that said Letters Patent is hereby corrected as shown below:

On Title Page:
Page 2, item (56), FOREIGN PATENT DOCUMENTS, Column 2, Line 24:
    Please correct "JP 2003-158076 A 5/2003"
        to read -- JP 2003-158075 A 5/2003 --

Line 28: Please correct "JP 2006-116896 A 4/2005"
        to read -- JP 2005-116896 A 4/2005 --

Page 3, item (56), OTHER PUBLICATIONS, Column 2, Line 1:
    Please correct "R. Schömer," to read -- R. Schörner, --

Line 17: Please correct "Ryu at al." to read -- Ryu et al. --

In the Specification:
Column 4, Line 48: Please correct "the n" to read -- the n$^-$ --

Column 12, Line 43: Please correct "FIG. 211," to read -- FIG. 2H, --

In the Claims:
Column 14, Claim 4, Line 41: Please correct "$n^{31}$" to read -- n$^-$ --

Column 14, Claim 5, Line 46: Please correct "$n^{31}$" to read -- n$^-$ --

Signed and Sealed this
Nineteenth Day of April, 2016

Michelle K. Lee
*Director of the United States Patent and Trademark Office*